US007663418B2

(12) United States Patent
Dale et al.

(10) Patent No.: US 7,663,418 B2
(45) Date of Patent: Feb. 16, 2010

(54) DRIVING CIRCUIT SLEW RATE COMPENSATION METHOD

(75) Inventors: Bret Roberts Dale, Jericho, VT (US); Ryan Andrew Jurasek, S. Burlington, VT (US); Darin James Daudelin, Williston, VT (US); Dave Eugene Chapmen, Shelburne, VT (US)

(73) Assignee: Nanya Technology Corp., Kuelshan, Tao-Yuan Hsien (TW)

( * ) Notice: Subject to any disclaimer, the term of this patent is extended or adjusted under 35 U.S.C. 154(b) by 148 days.

(21) Appl. No.: 11/969,209

(22) Filed: Jan. 3, 2008

(65) Prior Publication Data

US 2009/0174449 A1 Jul. 9, 2009

(51) Int. Cl.
H03K 5/12 (2006.01)
(52) U.S. Cl. ...................................... 327/170; 327/108
(58) Field of Classification Search .............. 326/26–28
See application file for complete search history.

(56) References Cited

U.S. PATENT DOCUMENTS 5,901,002 A * 5/1999 Bonaccio .................... 360/46
6,211,716 B1 * 4/2001 Nguyen et al. .............. 327/307
6,707,323 B1 * 3/2004 Matsuzaki et al. .......... 327/108
6,777,974 B2 * 8/2004 Eichfeld et al. ............... 326/26
7,038,512 B2 * 5/2006 Wilson et al. ............... 327/170
7,109,768 B2 * 9/2006 Rashid ....................... 327/170
7,218,148 B2 * 5/2007 Tian et al. .................... 326/82
2006/0256880 A1 * 11/2006 Frisch ........................ 375/257
2008/0157843 A1 * 7/2008 Young ........................ 327/261

* cited by examiner

Primary Examiner—Lincoln Donovan
Assistant Examiner—Thomas J Hiltunen
(74) Attorney, Agent, or Firm—Winston Hsu

(57) ABSTRACT

An apparatus for compensating slew rate of a driving circuit includes: a first circuit, for receiving an edge transition from the driving circuit and generating a first pulse proportional to an actual slope of the edge transition; a second circuit, for receiving an ideal edge transition of the driving circuit and generating a second pulse proportional to an ideal slope of the ideal edge transition; a comparison circuit, coupled to the first circuit and the second circuit, for comparing an extreme value of amplitude of the first pulse with an extreme value of amplitude of the second pulse to produce a comparison signal; and a control circuit, coupled to the comparison circuit, for increasing or decreasing the slew rate of the driving circuit according to the comparison signal.

10 Claims, 3 Drawing Sheets

DRIVING CIRCUIT SLEW RATE COMPENSATION METHOD

BACKGROUND OF THE INVENTION

1. Field of the Invention

This invention relates to driver circuits, and more particularly, to a method and system for compensating the slew rate of a driver circuit.

2. Description of the Prior Art

The invention of Integrated circuits (ICs) had a significant impact on the field of electrical engineering. Incorporating all circuits into a single chip has enabled miniscule devices such as the modern laptop computer and cell phones to be developed. Many ICs comprise off-chip driver circuits (OCDs) utilized for driving logic levels related to supply voltages for the IC off-chip. The OCD also functions as a protection against high voltages. A problem associated with off-chip drivers, however, is that the output slew rate has a wide variation caused by tolerances in process, voltage, temperature and output load.

In order to combat this problem, circuits for controlling an output slew rate have been developed. These systems aim to control the slew rate by enabling or disabling pre-driver devices. For example, certain control pins can be enabled or disabled so the gates of the output stage become correspondingly faster or slower. For a faster transition all pre-drivers must be turned on, whereas for a slower transition only one pre-driver needs to be turned on. Enable signals for pre-drivers are utilized to enable the pre-drivers. Calibration must be manual, however, as it is not known how many pre-drivers initially need to be enabled. This method is costly to implement, and a user will have to use a trial and error approach when determining certain parameters to configure the pre-driver circuit.

In order to provide a more automated approach to the slew rate control, other systems were developed. Please refer to FIG. 1. FIG. 1 is a diagram of a system 100 for controlling slew rate variation of an off-chip driver 160. As can be seen from the diagram, the system 100 comprises a delay locked loop (DLL) 110 consisting of a series of delay elements 112, a frequency divider (not shown) and a phase comparator (not shown). The output of the DLL 110 is coupled to a first XOR gate 120, which generates an ideal slew pulse. A rising (or falling) edge of the off-chip driver circuit 160 is input to a first comparator 152 and a second comparator 154 where the first comparator 152 switches at a high point and the second comparator 154 switches at a low point. The outputs of the first and second comparators 152, 154 are coupled to a second XOR gate 140, which generates a pulse that is proportional to an actual rise (or fall) time of the off-chip driver 160. The pulse from the first XOR gate 120 and the pulse from the second XOR gate 140 are then fed into a phase comparator 130 which generates a signal that determines whether or not to increase the strength of the pre-driver 165 in the off-chip driver 160.

Although this method is effective, the system 100 requires many elements, and the DLL 110 must also be set at the start of a slew rate compensation operation.

SUMMARY OF THE INVENTION

It is therefore an objective of the present invention to provide a method and apparatus for slew rate compensation of an off-chip driver that simplifies the conventional art.

With this in mind, an apparatus for compensating slew rate of a driving circuit is provided. The apparatus comprises: a first circuit, for receiving an edge transition from the driving circuit and generating a first pulse proportional to an actual slope of the edge transition; a second circuit, for receiving an ideal edge transition of the driving circuit and generating a second pulse proportional to an ideal slope of the ideal edge transition; a comparison circuit, coupled to the first circuit and the second circuit, for comparing a peak magnitude value of amplitude of the first pulse with a peak magnitude value of amplitude of the second pulse to produce a comparison signal; and a control circuit, coupled to the comparison circuit, for increasing or decreasing the slew rate of the driving circuit according to the comparison signal.

A method for controlling slew rate of a driving circuit is also disclosed. The method comprises: utilizing an edge transition time of a driving circuit to generate a first pulse proportional to a slope of the edge transition; capturing a peak magnitude value of amplitude of the first pulse; utilizing an ideal edge transition time to generate a second pulse proportional to a slope of the ideal edge transition; capturing a peak magnitude value of amplitude of the second pulse; comparing the peak magnitude value of amplitude of the first pulse with the peak magnitude value of amplitude of the second pulse; and utilizing the comparison result to increase or decrease the slew rate of the driving circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
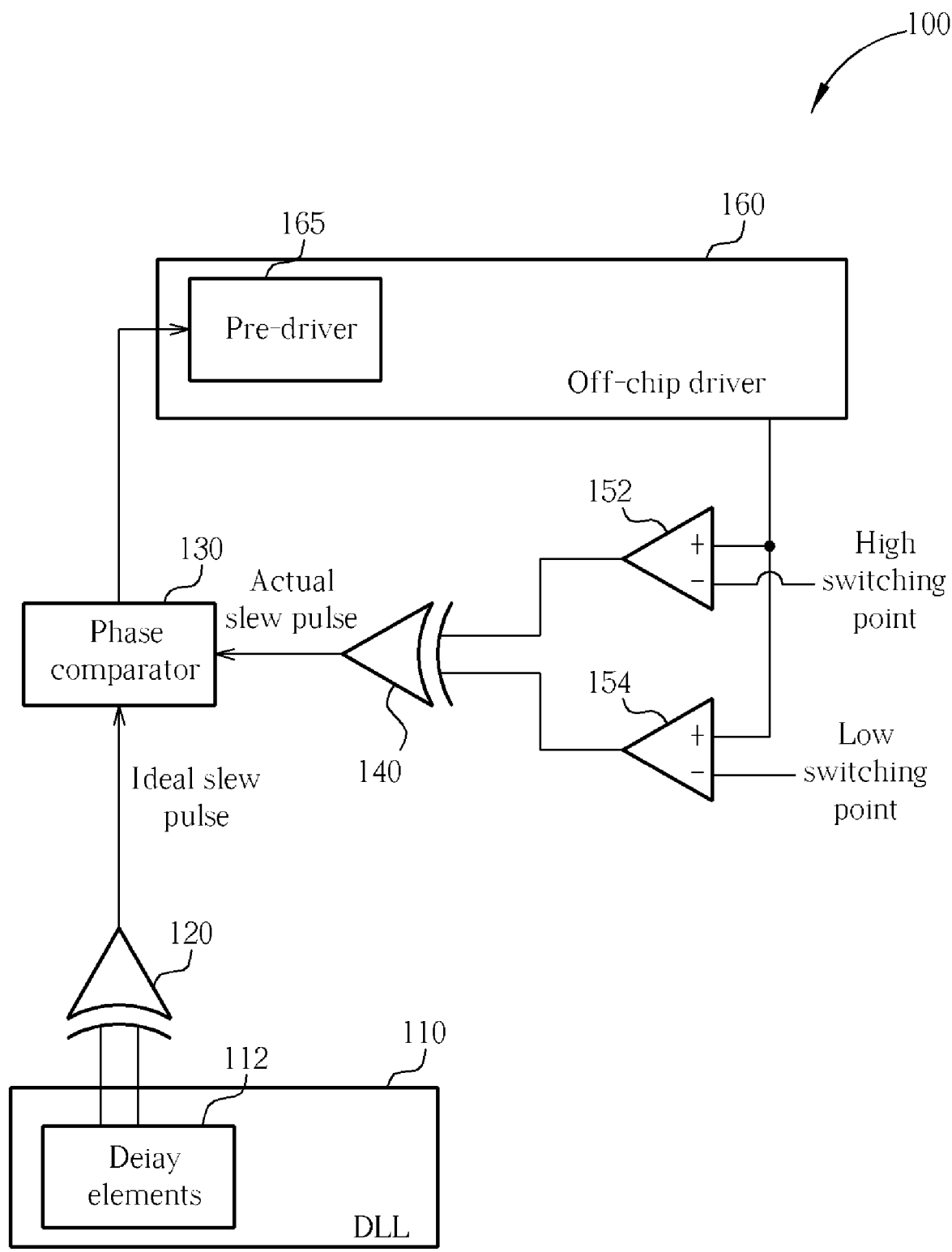
FIG. 1 is a diagram of a circuit for compensating slew rate of an off-chip driver according to the prior art.
Figure 2:
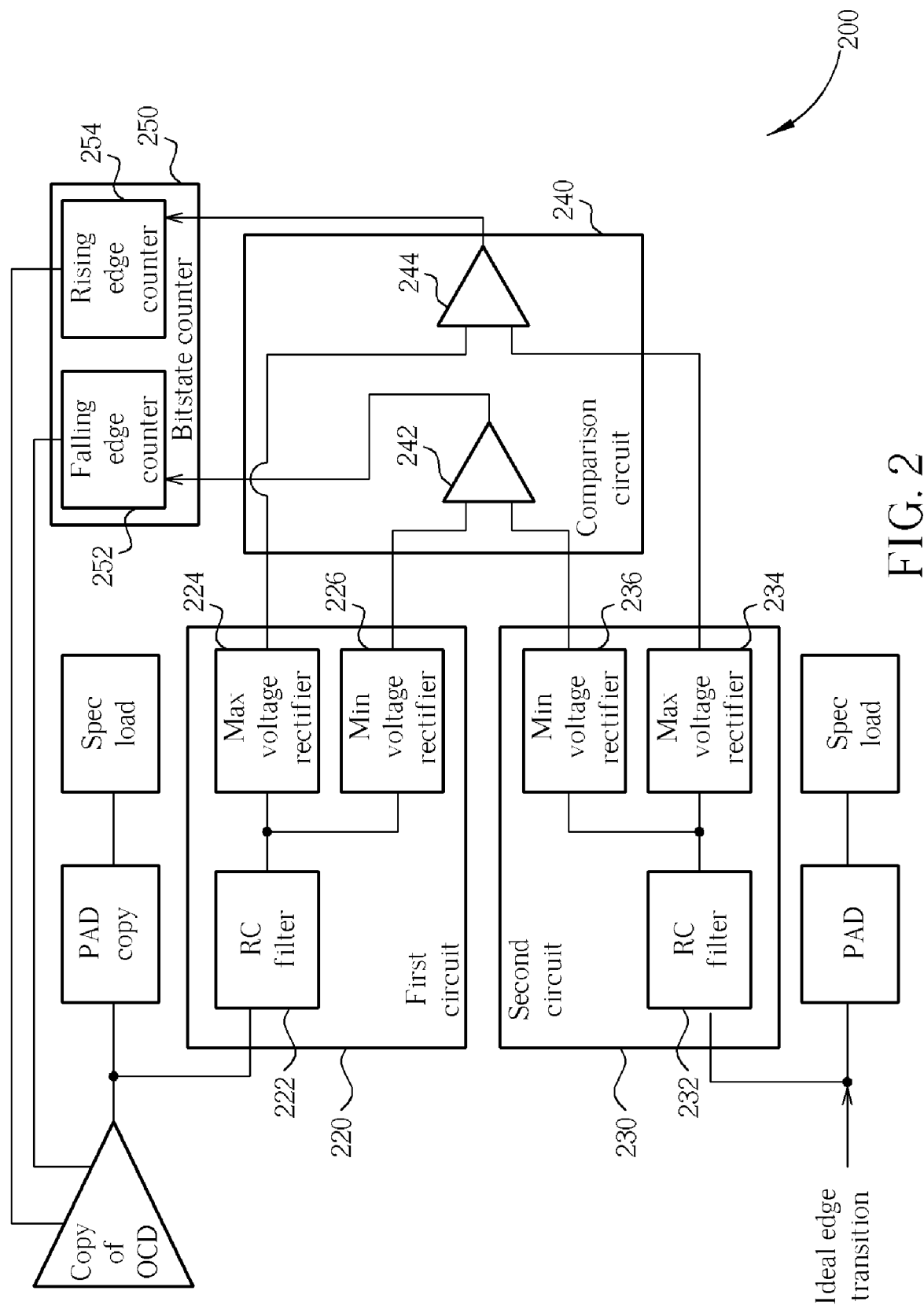
FIG. 2 is a diagram of a circuit for compensating slew rate of an off-chip driver according to an exemplary embodiment of the present invention.

Please refer to FIG. 2. FIG. 2 is a diagram of an apparatus 200 according to an exemplary embodiment of the present invention. The apparatus comprises a first circuit 220 comprising an RC filter 222, a maximum voltage rectifier 224 and a minimum voltage rectifier 226. The input of the first circuit 220 is an edge transition from the off-chip driver. The apparatus 200 further comprises a second circuit 230 comprising an RC filter 232, a maximum voltage rectifier 234 and a minimum voltage rectifier 236. The input of the second circuit 230 is an ideal edge transition, which can be generated off-chip. The edge transition and ideal edge transition can be rising edges or falling edges.

The first circuit 220 and second circuit 230 are coupled to a comparison circuit 240. The comparison circuit 240 comprises a first comparator 242 and a second comparator 244. Specifically, the outputs of the minimum voltage rectifiers 226, 236 are coupled to the first comparison circuit 242 and the outputs of the maximum voltage rectifiers 224, 234 are coupled to the second comparator 244. The comparison circuit 240 is coupled to a bitstate counter 250. The bitstate counter 250 comprises a falling edge counter 252 and a rising edge counter 254. Specifically, the output of the first comparator 242 is coupled to the falling edge counter 252 and the output of the second comparator 244 is coupled to the rising edge counter 254.

As mentioned above, the edge transition and ideal edge transition can be falling or rising edges. In the following description, an operation of the apparatus 200 when rising edge transitions are utilized will be described. Please note that the operation of the system is substantially the same for falling edge transitions except that the minimum voltage rectifiers 226, 236 and the falling edge counter 252 will be utilized.

A rise transition from the off-chip driver arrives at the first circuit 220. At the same time, an ideal rising edge transition arrives at the second circuit 230. The RC filter 222 will generate a rising pulse, where the magnitude of the pulse is proportional to a slope of the rising edge. The maximum voltage rectifier 224 then captures a maximum magnitude of the rising pulse. As mentioned above, when the pulse is a falling pulse, the minimum voltage rectifier 226 will be utilized, and will capture a minimum magnitude of the falling pulse. The RC filter 232 of the second circuit 230 generates a rising pulse according to the ideal rising edge transition. The maximum voltage rectifier 234 then captures a maximum magnitude of the ideal rising pulse.

The maximum magnitude of the rising pulse and the maximum magnitude of the ideal rising pulse are then input to the comparison circuit 240, into the second comparator 244. The comparison circuit 240 operates to determine if an output stage transition of the off-chip driver needs to be faster or slower in order to match the ideal rising edge transition. The second comparator 244 compares the two values and then outputs a comparison result, which will be input to the bitstate counter 250; specifically, the rising edge counter 254.

The rising edge counter 254 utilizes the comparison result to selectively increment or decrement. If the ideal rising edge transition is faster than the rising edge transition from the off-chip driver, then the output stage transition can be pushed to go faster. In this case, the rising edge counter 254 will increment. In general, the bitstate counter 250 is digital so it will increment (or decrement) by one bit at a time. Please note that this is not a limitation of the invention, and that the bitstate counter can also be implemented by an analog counter.

The above stages will be repeatedly performed until the rising edge transition from the off-chip driver and the ideal rising edge transition match. The comparison of the two values, and the generation of bus signals according to the comparison step push the pre-drive of the off-chip driver in a direction to control the output slew rate.

Figure 3:
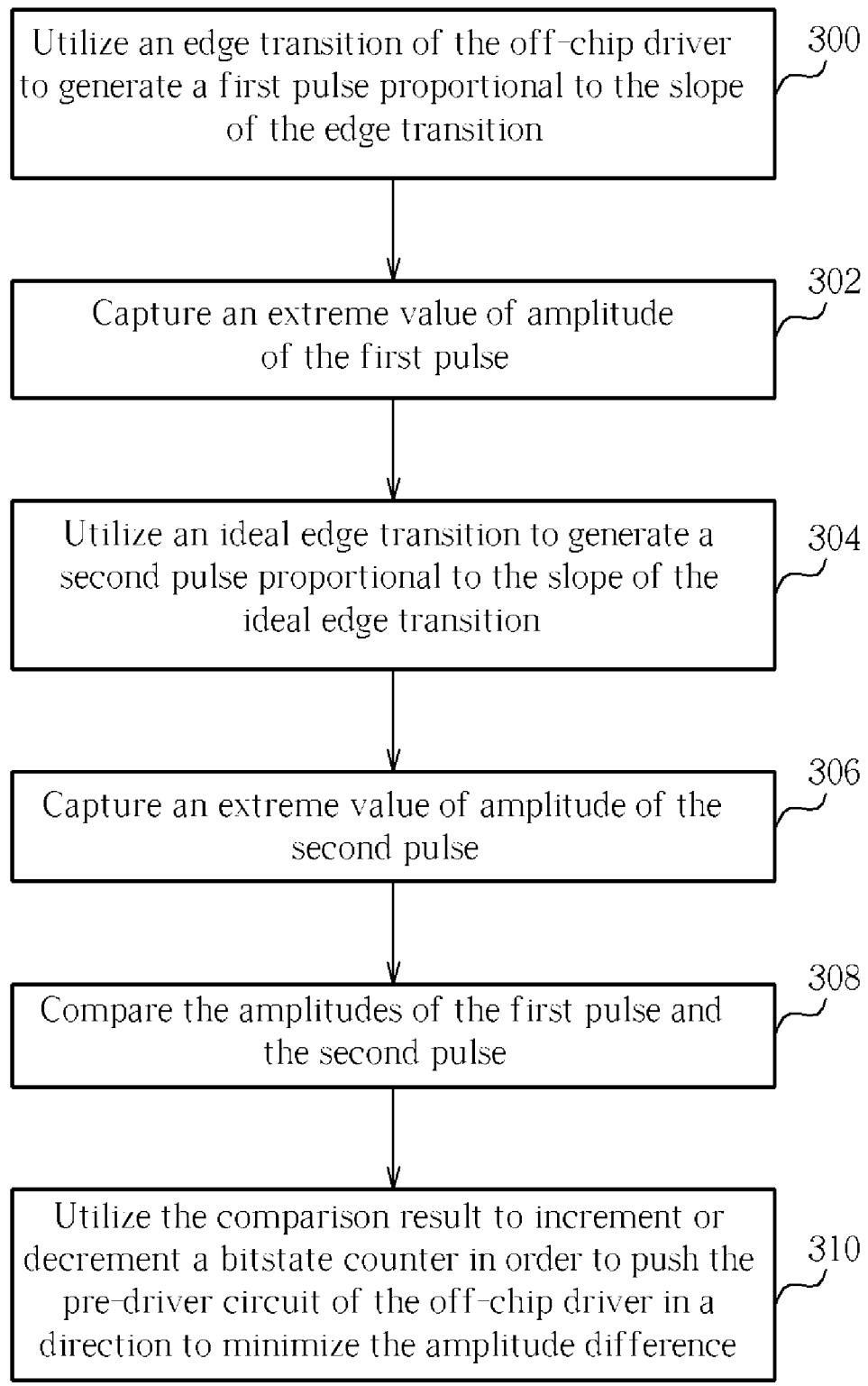
FIG. 3 is a flowchart of a method for compensating slew rate of an off-chip driver according to the apparatus shown in FIG. 2.

Please refer to FIG. 3. FIG. 3 is a flowchart showing an operation of the apparatus 200 shown in FIG. 2. The steps are as follows:

Step 300: Utilize an edge transition of the off-chip driver to generate a first pulse proportional to a slope of the edge transition;

Step 302: Capture an extreme value of amplitude of the first pulse;

Step 304: Utilize an ideal edge transition to generate a second pulse proportional to a slope of the ideal edge transition;

Step 306: Capture an extreme value of amplitude of the second pulse;

Step 308: Compare the amplitudes of the first pulse and the second pulse;

Step 310: Utilize the comparison result to increment or decrement a bitstate counter in order to push the pre-driver circuit of the off-chip driver in a direction to minimize the amplitude difference.

An edge transition from an off-chip driver is input to the RC filter 222 to generate a first pulse (Step 300). The first pulse is then input to the maximum voltage rectifier 224 or minimum voltage rectifier 226 to capture an extreme value of amplitude of the first pulse (Step 302). An ideal edge transition is input to the RC filter 232 to generate a second pulse (Step 304) and then input to the maximum voltage rectifier 234 or minimum voltage rectifier 236 to capture an extreme value of amplitude of the second pulse (Step 306). The extreme value of amplitude of the first pulse and the extreme value of amplitude of the second pulse are input to the comparison circuit 240 (the first comparator 242 when edge transitions are falling edge transitions, and the second comparator 244 when edge transitions are rising edge transitions) and the amplitudes are compared (Step 308). Finally, the comparison result is input to the bitstate counter 250, and the falling edge counter 252 or rising edge counter 254 is selectively incremented or decremented according to the comparison signal in order to push the pre-driver circuit of the off-chip driver in a direction to minimize the amplitude difference (Step 310).

By utilizing an ideal edge transition and comparing the ideal edge transition with an actual edge transition from an off-chip driver, the apparatus 200 can function as a calibration circuit, by utilizing the bitstate counter 250 to produce digital bus signals that can be utilized for a plurality of off-chip drivers for an IC.

Those skilled in the art will readily observe that numerous modifications and alterations of the device and method may be made while retaining the teachings of the invention.

What is claimed is:

1. An apparatus for compensating slew rate of a driving circuit, the apparatus comprising:
   a first circuit, for receiving an edge transition from the driving circuit and generating a first pulse proportional to a slope of the edge transition, comprising:
      a first filter, for generating the first pulse in response to the edge transition; and
      a first voltage rectifier, coupled to the first filter, for determining the extreme value of amplitude of the first pulse;
   a second circuit, for receiving an ideal edge transition of the driving circuit and generating a second pulse proportional to an ideal slope of the ideal edge transition, comprising:
      a second filter, for generating the second pulse in response to the ideal edge transition; and
      a second voltage rectifier, coupled to the second filter, for determining the extreme value of amplitude of the second pulse;
   a comparison circuit, coupled to the first circuit and the second circuit, for comparing an extreme value of amplitude of the first pulse with an extreme value of amplitude of the second pulse to produce a comparison signal; and a control circuit, coupled to the comparison circuit, for increasing or decreasing the slew rate of the driving circuit according to the comparison signal.

2. The apparatus of claim 1, wherein the edge transition and the ideal edge transition are rising edges.

3. The apparatus of claim 2, wherein the first voltage rectifier is a maximum voltage rectifier, and the second voltage rectifier is a maximum voltage rectifier.

4. The apparatus of claim 1, wherein the edge transition and the ideal edge transition are falling edges.

5. The apparatus of claim 4, wherein the first voltage rectifier is a minimum voltage rectifier, and the second voltage rectifier is a minimum voltage rectifier.

6. The apparatus of claim 1, wherein the control circuit is a bitstate counter for increasing or decreasing the slew rate of the driving circuit by selectively decrementing or incrementing by one bit according to the comparison signal.

7. A method for compensating slew rate of a driving circuit comprises:

filtering an edge transition time of a driving circuit to generate a first pulse proportional to a slope of the edge transition;

voltage rectifying the first pulse to capture an extreme value of amplitude of the first pulse;

filtering an ideal edge transition time to generate a second pulse proportional to a slope of the ideal edge transition;

voltage rectifying the second pulse to capture an extreme value of amplitude of the second pulse;

comparing the extreme value of amplitude of the first pulse with the extreme value of amplitude of the second pulse; and utilizing the comparison result to increase or decrease the slew rate of the driving circuit.

8. The method of claim 7, wherein the edge transition and the ideal edge transition are rising edges.

9. The method of claim 7, wherein the edge transition and the ideal edge transition are falling edges.

10. The method of claim 7, wherein the step of utilizing the comparison result to increase or decrease the slew rate of the driving circuit comprises:

incrementing or decrementing a bitstate counter according to the comparison result in order to push a pre-driver circuit of the off-chip driver in a direction to minimize the amplitude difference.

* * * * *

UNITED STATES PATENT AND TRADEMARK OFFICE
CERTIFICATE OF CORRECTION

PATENT NO. : 7,663,418 B2  Page 1 of 1
APPLICATION NO. : 11/969209
DATED : February 16, 2010
INVENTOR(S) : Bret Roberts Dale et al.

It is certified that error appears in the above-identified patent and that said Letters Patent is hereby corrected as shown below:

On the title page, item (73), correct the residence of the Assignee from "KueIshan" to --Kueishan--.

Signed and Sealed this

Sixth Day of April, 2010

David J. Kappos
*Director of the United States Patent and Trademark Office*